United States Patent
Zhang et al.

(10) Patent No.: US 8,212,527 B2
(45) Date of Patent: Jul. 3, 2012

(54) METHOD AND APPARATUS FOR TELEMATICS-BASED VEHICLE NO-START PROGNOSIS

(75) Inventors: Yilu Zhang, Northville, MI (US); Mutasim A. Salman, Rochester Hills, MI (US); Ryan M. Edwards, Macomb, MI (US); John J. Correia, Livonia, MI (US); Mark J. Rychlinski, Farmington Hills, MI (US); Gary W Gantt, Jr., Sterling Heights, MI (US); Halasya Siva Subramania, Bangalore (IN); Kyle L Lobes, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 945 days.

(21) Appl. No.: 12/181,683

(22) Filed: Jul. 29, 2008

(65) Prior Publication Data

US 2010/0026306 A1    Feb. 4, 2010

(51) Int. Cl.
*H02J 7/00* (2006.01)
*H02J 7/14* (2006.01)
*H02J 7/16* (2006.01)

(52) U.S. Cl. ........ 320/132; 320/104; 320/152; 320/157; 320/159; 320/162

(58) Field of Classification Search .................... 320/132
See application file for complete search history.

(56) References Cited

U.S. PATENT DOCUMENTS 5,422,822 A * 6/1995 Toyota et al. .................. 702/63
5,444,378 A    8/1995 Rogers
5,758,300 A * 5/1998 Abe .............................. 455/424
(Continued)

FOREIGN PATENT DOCUMENTS

KR    10-2008-0038760 A    5/2008

OTHER PUBLICATIONS

Mutasim A. Salman et al., U.S. Appl. No. 11/736,151 entitled "Method and Apparatus for Monitoring an Electrical Energy Storage Device", filed Apr. 17, 2007.

(Continued)

*Primary Examiner* — Edward Tso
*Assistant Examiner* — Ahmed Omar
(74) *Attorney, Agent, or Firm* — John A. Miller; Miller IP Group, PLC

(57) ABSTRACT

A system and method for determining the status of a vehicle battery to determine whether the battery may not have enough charge to start the vehicle. The method includes collecting data relating to the battery on the vehicle and collecting data relating to the battery at a remote back-office. Both the vehicle and the remote data center determine battery characteristics based on the collected data and the likelihood of a vehicle no-start condition, where the algorithm used at the remote back-office may be more sophisticated. The data collected at the remote back-office may include vehicle battery information transmitted wirelessly from the vehicle, and other information, such as temperature, battery reliability, miles that the vehicle has driven per day, ambient temperature, high content vehicle, etc. Both the vehicle and the remote back-office may determine the battery open circuit voltage.

19 Claims, 5 Drawing Sheets

U.S. PATENT DOCUMENTS

| | | | |
|---|---|---|---|
| 6,084,523 A | 7/2000 | Gelnovatch et al. | |
| 7,646,172 B2* | 1/2010 | Jones | 320/132 |
| 7,705,602 B2* | 4/2010 | Bertness | 324/426 |
| 8,068,951 B2* | 11/2011 | Chen et al. | 701/33 |
| 2006/0132092 A1 | 6/2006 | Hoffman et al. | |
| 2007/0132456 A1 | 6/2007 | Salman et al. | |
| 2008/0315830 A1* | 12/2008 | Bertness | 320/104 |

OTHER PUBLICATIONS

Mutasim A. Salman et al., U.S. Appl. No. 11/853,865 entitled "Method and System for Monitoring an Electrical Energy Storage Device", filed Sep. 12, 2007.

* cited by examiner

METHOD AND APPARATUS FOR TELEMATICS-BASED VEHICLE NO-START PROGNOSIS

BACKGROUND OF THE INVENTION

1. Field of the Invention

This invention relates generally to a system and method for determining that the state of charge (SOC) of a vehicle battery may be too low to start the vehicle at the next vehicle start-up and, more particularly, to a system and method for determining that the state of charge of a vehicle battery may be too low to start the vehicle at the next start-up, where information concerning the vehicle battery is stored and processed at a remote back-office and transmitted to the vehicle telematically.

2. Discussion of the Related Art

Vehicles typically employ a battery that provides power to various vehicle systems generally when the vehicle engine is not running. The vehicle battery also provides the power necessary to start the vehicle in response to a start command from a vehicle driver, such as turning the ignition key. When the vehicle engine is running, a vehicle generator recharges the vehicle battery. If the battery state of charge (SOC) is too low, the battery may not be able to supply the necessary power to start the vehicle. Further, a low battery SOC impacts the battery state of health (SOH) in the long term, typically resulting in prematurely defective batteries.

A battery's state of charge deteriorates as a result of various reasons. Without any load, a battery has a constant self-discharge that increases as the battery temperature increases. Further, vehicle parasitic loads as a result of the operation of electrical devices when the vehicle is off, such as the periodic wake-up of remote keyless entry systems and security system modules, draws power from the battery and reduces its SOC. Also, vehicle system faults, such as stuck-closed relays, may create inadvertent loads that drain the battery. After market consumer electronic devices, such as CD players, computers and cell phone chargers, plugged in when the vehicle is off will further drain the vehicle battery.

Moreover, depending on driving profile, such as driving frequency, duration and average speed of trips, the battery may not be charged enough by the vehicle generator. Unless the battery is put on an external battery charger, the vehicle battery is only charged by the vehicle generator when the vehicle is driven, which is constrained by vehicle speed. Local trips at low vehicle speed may not allow the generator to charge the battery after supplying power to all of the on-board electrical loads. Infrequent short trips may not charge the battery long enough to recover the charge lost due to the reasons discussed above.

In addition, a battery defect may prevent the battery from suitably accepting or holding charge. Further, the battery's ability to provide a sufficient vehicle start is reduced when its temperature is low, such as below zero Celsius.

Therefore, a system and method are needed to determine the battery state of charge and warn a vehicle driver about a possible vehicle no-start condition.

SUMMARY OF THE INVENTION

In accordance with the teachings of the present invention, a system and method are disclosed for determining the status of a vehicle battery to determine whether the battery may not have enough charge to start the vehicle. The method includes collecting data relating to the battery on the vehicle and collecting data relating to the battery at a remote back-office. Both the vehicle and the back-office determine battery characteristics based on the collected data and the likelihood of a vehicle no-start condition, where the algorithm used at the back-office may be more sophisticated. The data collected at the back-office may include vehicle battery information transmitted wirelessly from the vehicle, and other information, such as temperature, battery reliability, miles that the vehicle has driven per day, ambient temperature, level of vehicle electrical and electronic content, etc. Both the vehicle and the back-office may determine the battery open circuit voltage.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for determining battery state of charge is merely exemplary in nature, and is in no way intended to limit the invention or its applications or uses.

As will be discussed in detail below, the present invention proposes a system and method that collects various data and information about a vehicle battery, determines the state of health of the battery based on the collected information and notifies a vehicle driver that the vehicle battery may not have enough charge to start the vehicle. The vehicle may include an on-board processing module that includes limited processing capability to analyze signals from various vehicle systems and sensors to provide the indication of a vehicle no-start condition. Additionally, the system may include a back-office module having a greater processing capability and storage capability to analyze information about a vehicle battery and communicate telematically to the vehicle operator to identify a vehicle no-start condition.

Figure 1:
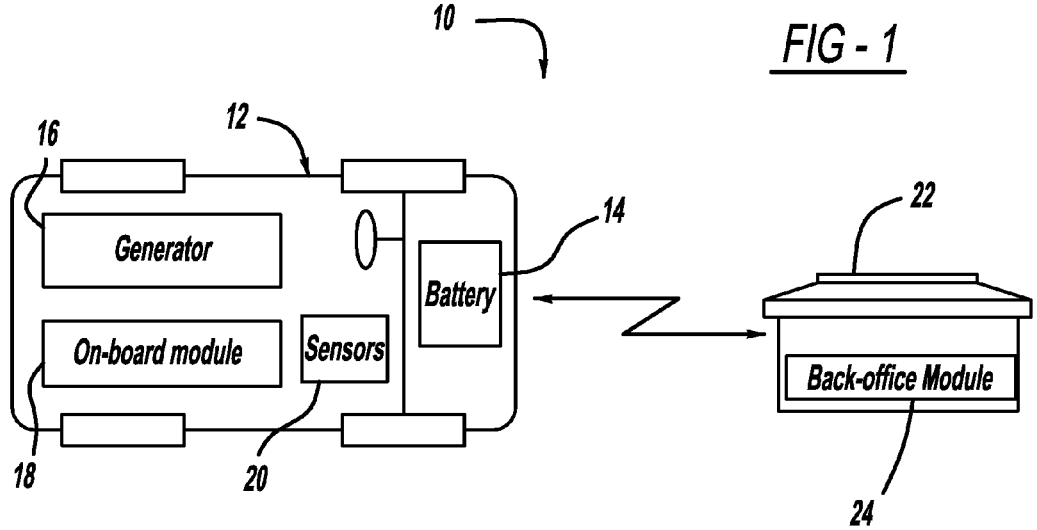
FIG. 1 is an illustration of a vehicle including an on-board module for processing battery status information and a back-office module that receives information about the battery on the vehicle telematically to also provide battery status processing.

FIG. 1 is an illustration of a system 10 that processes and transmits vehicle battery information concerning the state of charge, health and status of a battery 14 on a vehicle 12. The vehicle 12 includes a generator 16 that recharges the battery 14 when the vehicle 12 is operating. Further, the vehicle 12 includes an on-board module 18 that processes various vehicle information relating to the battery to determine its state of charge. The on-board module 18 receives various information from vehicle sensors 20, or other vehicle sub-systems and ECUs. The system 10 also includes a remote back-office 22 remote from the vehicle 12 that includes a back-office module 24 that also analyzes and processes vehicle battery information received from the vehicle 12 telematically and other relevant information. The operation of the on-board module 18 and the back-office module 24 will be discussed in detail below.

During ignition on, the on-board module 18 continuously monitors all or a subset of the vehicle battery information including, but not limited to, battery current, battery voltage, battery temperature, vehicle speed, generator current, generator voltage, engine RPM, vehicle odometer reading, etc., that is typically provided by the vehicle sensors 20. This information may also come from other on-board systems or electronic control units (ECUs). The data can be unprocessed raw measurements, such as voltage, or on-board pre-processed information, such as trouble codes. During ignition off, the monitoring frequency of the battery information may be reduced to prevent battery drainage.

The on-board module 18 operates an algorithm in a scheduler to detect inadequate battery state of charge. The on-board module 18 telematically uploads all or a subset of vehicle engineering data to the remote back-office 22 either based on the detection results or on time. Depending on the available on-board computational power, the algorithm can be relatively simple. In one embodiment, the algorithm determines if the battery open circuit voltage (OVC) $V_{oc}$ is less than a predetermined threshold voltage. The threshold voltage can be a function of battery state of health (SOH) if the threshold is estimated on-board. Generally, when the battery state of health is relatively high, the threshold voltage is set to be relatively high.

In another embodiment for the on-board module 18, the algorithm can determine whether the battery discharge current during ignition off is greater than a predetermined threshold, such as 10 amps. The threshold can also be a function of battery state of health if the information is estimated on-board. In general, when the battery SOH is relatively low, the threshold is set to be relatively low.

The back-office module 24 archives the uploaded vehicle engineering data in a database for individual vehicles. The back-office module 24 runs an algorithm in a predetermined schedule to predict vehicle no-start conditions for each individual vehicle, and determines the content and urgency of a notification to be sent to the vehicle driver. In one embodiment, the back-office module 24 runs an algorithm for a specific vehicle upon receiving the vehicle data upload. In another embodiment, the back-office module 24 runs the algorithm periodically, for example, once a month.

The back-office module algorithm receives as inputs not only the vehicle engineering data uploaded from the specific vehicle, but also other information, including, but not limited to, weather/temperature forecast, vehicle usage history, battery age, battery reliability, vehicle electrical system reliability and vehicle operator personal information, such as future plans for long distance driving and expected long-term airport parking. The vehicle driver will have the option to provide or not provide his/her personal information.

The back-office module algorithm can be much more sophisticated than the on-board module algorithm. In one embodiment, the back-office module algorithm may have multiple if-then rules.

Figure 2:
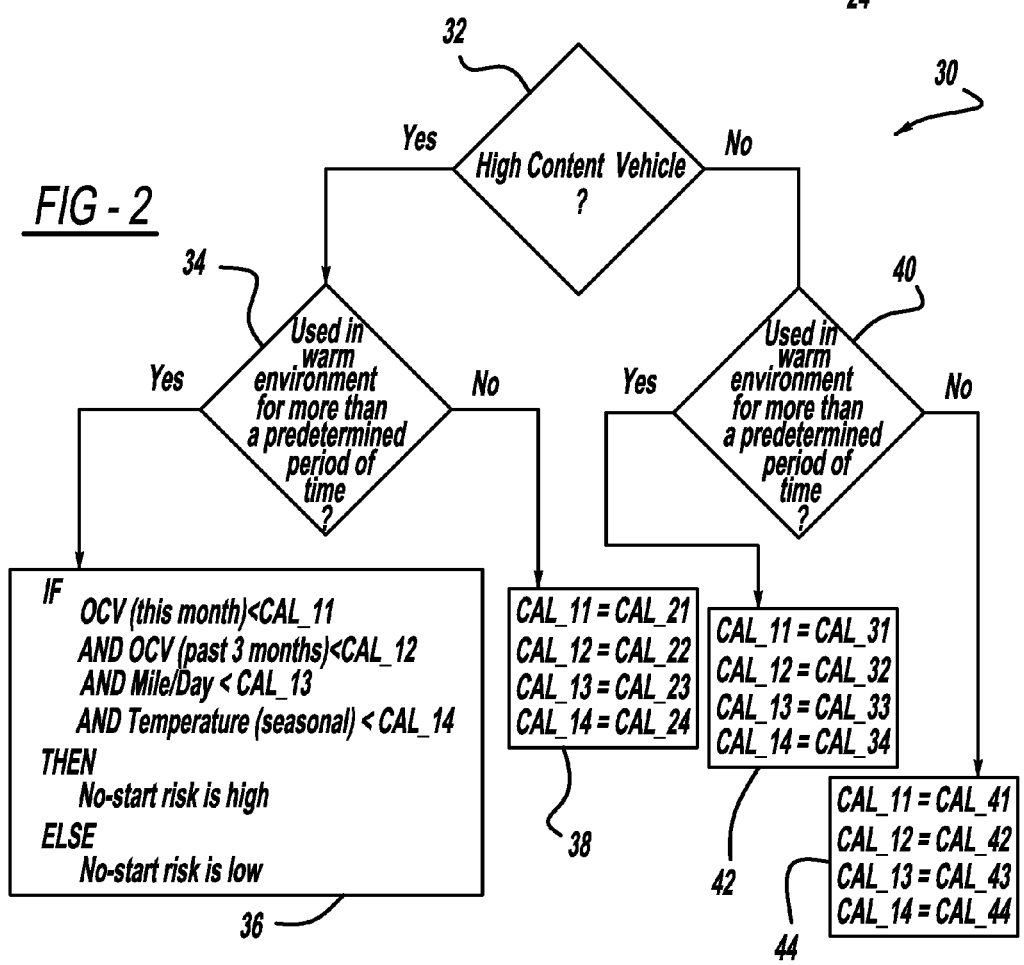
FIG. 2 is a flow chart diagram showing a process for remotely determining that a battery may not have enough charge for vehicle start-up, according to an embodiment of the present invention.

FIG. 2 is a flow chart diagram 30 showing one non-limiting example of an algorithm employed by the back-office module 24. In this embodiment, the determination of vehicle startability is based almost solely on vehicle history information. The process starts at decision diamond 32 where the algorithm determines whether the vehicle is a high content vehicle. In this context, a high content vehicle is a vehicle that includes many different electrical sub-systems that may relatively quickly drain battery power when the vehicle is off. A determination of whether a vehicle is a high content vehicle or not can be decided in various and different manners. If the vehicle is a high content vehicle, then the algorithm determines whether the vehicle has been operated in a warm environment for a predetermined period of time at decision diamond 34. The determination of whether the vehicle has been driven in a warm environment goes directly to whether the battery 14 has aged faster than normal. As will be discussed below, the various thresholds that are used to determine the battery status will depend on whether the vehicle is a high content vehicle, whether the vehicle is being driven in a warm environment or not, and possibly other factors.

If the vehicle 12 has been driven in a warm environment at the decision diamond 34, then the algorithm goes through one process to determine whether there is a risk for a no-start condition as a result of battery state of charge being too low at box 36. In this non-limiting embodiment, the algorithm determines whether the open circuit voltage (OVC) of the battery 14 is less than a first predetermined voltage threshold Cal_11, such as 12.3 volts. The algorithm also determines if the average open circuit voltage over the past three months of vehicle use has been less than a second predetermined voltage threshold Cal_12, such as 12.4 volts. The algorithm also determines whether the miles driven per day of the vehicle is less than a predetermined miles threshold Cal_13, such as twenty miles per day. The algorithm also determines whether the ambient temperature is below a predetermined temperature threshold Cal_14, such as 0° C. If all four of these conditions have been met, then the algorithm determines that the risk for a vehicle no-start condition is high, otherwise it determines that the no-start risk is low.

These four determinations that affect the battery state of charge and battery charging ability are merely representative of one way of determining whether there is a risk for a no-start condition. Each of the threshold values can be weighted, and other algorithms do not need to satisfy all of the conditions to determine that there is a high risk of a vehicle no-start condition. Also, other battery conditions can be considered. Further, the various thresholds can be any suitable threshold for a particular battery or vehicle.

If the vehicle 12 has not been driven in a warm environment at the decision diamond 34, then the algorithm goes through the same no-start determination, but may use different thresholds at box 38. For example, the first voltage threshold Cal_11 may be voltage threshold Cal_21, which may be 12.2 volts, the second voltage threshold Cal_12 may be voltage threshold Cal_22, which may be 12.3 volts, the miles threshold Cal_13 may be miles threshold Cal_23, which may be 10 miles per day, and the temperature threshold Cal_14 may be temperature threshold Cal_24, which may be −5° C.

If the vehicle 12 is not a high content vehicle at the decision diamond 32, the algorithm again determines whether the vehicle has been driven in a warm environment for more than a predetermined period of time at decision diamond 40. As above, the thresholds may be changed if the vehicle 12 is not a high content vehicle and has been driven in a warm environment at box 42 and the vehicle 12 is not a high content vehicle and has not been driven in a warm environment at box 44. For example, at the box 42, the first voltage threshold Cal_11 may be voltage threshold Cal_31, which may be 12.2 volts, the second voltage threshold Cal_12 may be voltage threshold Cal_32, which may be 12.3 volts, the miles threshold Cal_13 may be miles threshold Cal_33, which may be 20 miles per day, and the temperature threshold Cal_14 may be temperature threshold Cal_34, which may be 0° C.

Likewise, for the box 44, the first voltage threshold Cal_11 may be voltage threshold Cal_41, which may be 12.1 volts, the second voltage threshold Cal_12 may be voltage threshold Cal_42, which may be 12.2 volts, the miles threshold Cal_13 may be miles threshold Cal_43, which may be 10 miles per day, and the temperature threshold Cal_14 may be temperature threshold Cal_44, which may be −5° C.

According to another embodiment of the present invention, the back-office module 24 uses an open circuit voltage prediction model to predict the open circuit voltage of the battery 14, and if that open circuit voltage is less than some predetermined OCV threshold, then the algorithm determines that there is a risk for a no-start condition at the next vehicle start-up. In this embodiment, the vehicle battery parameters at a future time of cranking the vehicle 12 are determined as a function of history, and the vehicle startability is determined based on the predicted vehicle battery parameters.

Figure 3:
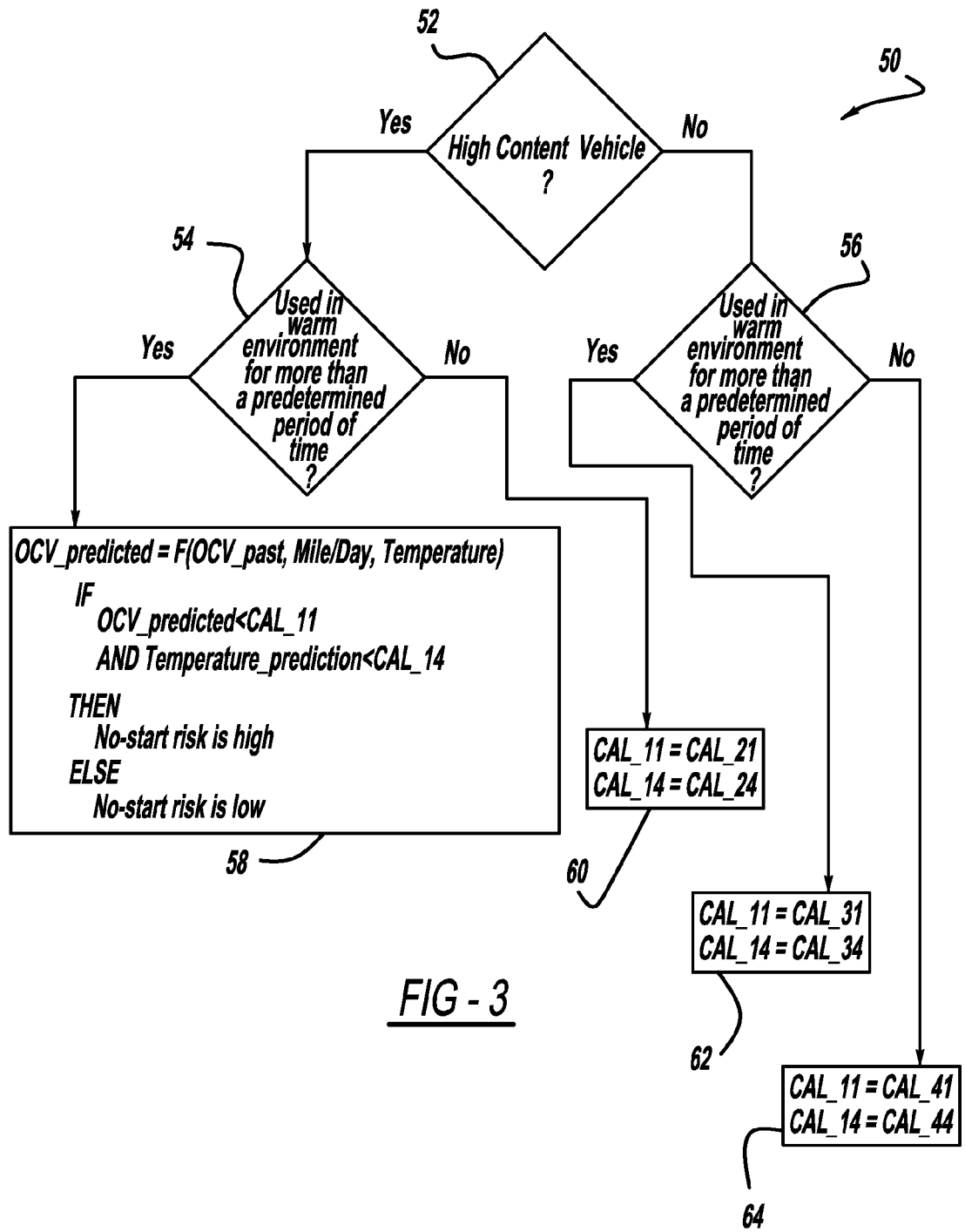
FIG. 3 is a flow chart diagram showing a process for remotely determining that a battery may not have enough charge for vehicle start-up, according to another embodiment of the present invention.

FIG. 3 is a flow chart diagram 50, similar to the flow chart diagram 30, that uses the open circuit voltage prediction model. As above, the algorithm determines whether the vehicle is a high content vehicle at decision diamond 52, and determines whether the vehicle has been in a warm environment for a predetermined period of time at decision diamonds 54 and 56. In this embodiment, the algorithm determines an open circuit voltage of the battery 14 at box 58 as a function of past open circuit voltages of the battery 14, miles driven per day and ambient temperature. Any suitable open circuit voltage model can be used for this determination, as would be appreciated by those skilled in the art. The algorithm then determines whether the predetermined open circuit voltage is less than a predetermined open circuit voltage threshold, such as the voltage threshold Cal_11, and determines whether a predicted ambient temperature for the near future is less than a predetermined temperature threshold, such as temperature threshold Cal_14. If both of these conditions are met, then the algorithm determines that the risk of the no-start condition is high, otherwise the no-start condition risk is determined to be low. As above, the conditions can be weighted and can be analyzed independently.

For the condition where the vehicle 12 is a high content vehicle and is not used in a warm environment at box 60, the voltage threshold Cal_11 can be the voltage threshold Cal_21, and the temperature threshold can be the temperature threshold Cal_24. Likewise, for the situation where the vehicle 12 is not a high content vehicle and has been driven in a warm environment for a predetermined period of time at box 62, the voltage threshold Cal_11 can be the voltage threshold Cal_31 and the temperature threshold Cal_14 can be the temperature threshold Cal_34. Also, if the vehicle 12 is not a high content vehicle and has not been driven in a warm environment at box 64, the voltage threshold Cal_11 can be the voltage threshold Cal_41 and the temperature threshold Cal_14 can be the temperature threshold Cal_44.

As discussed above, the embodiment of FIG. 2 determines vehicle startability by information that is inferred directly from history parameters based on certain models, and the embodiment of FIG. 3 determines vehicle and battery parameters at a future instance of cranking that are predicted using certain models. The vehicle startability is then determined at the future instance of cranking based on the predicted vehicle and battery parameters. Both of these embodiments can employ various models, such as decision trees, Bayesian networks, neural networks, regression, support vector machines, and their combinations, etc. to perform the analysis.

Figure 4:
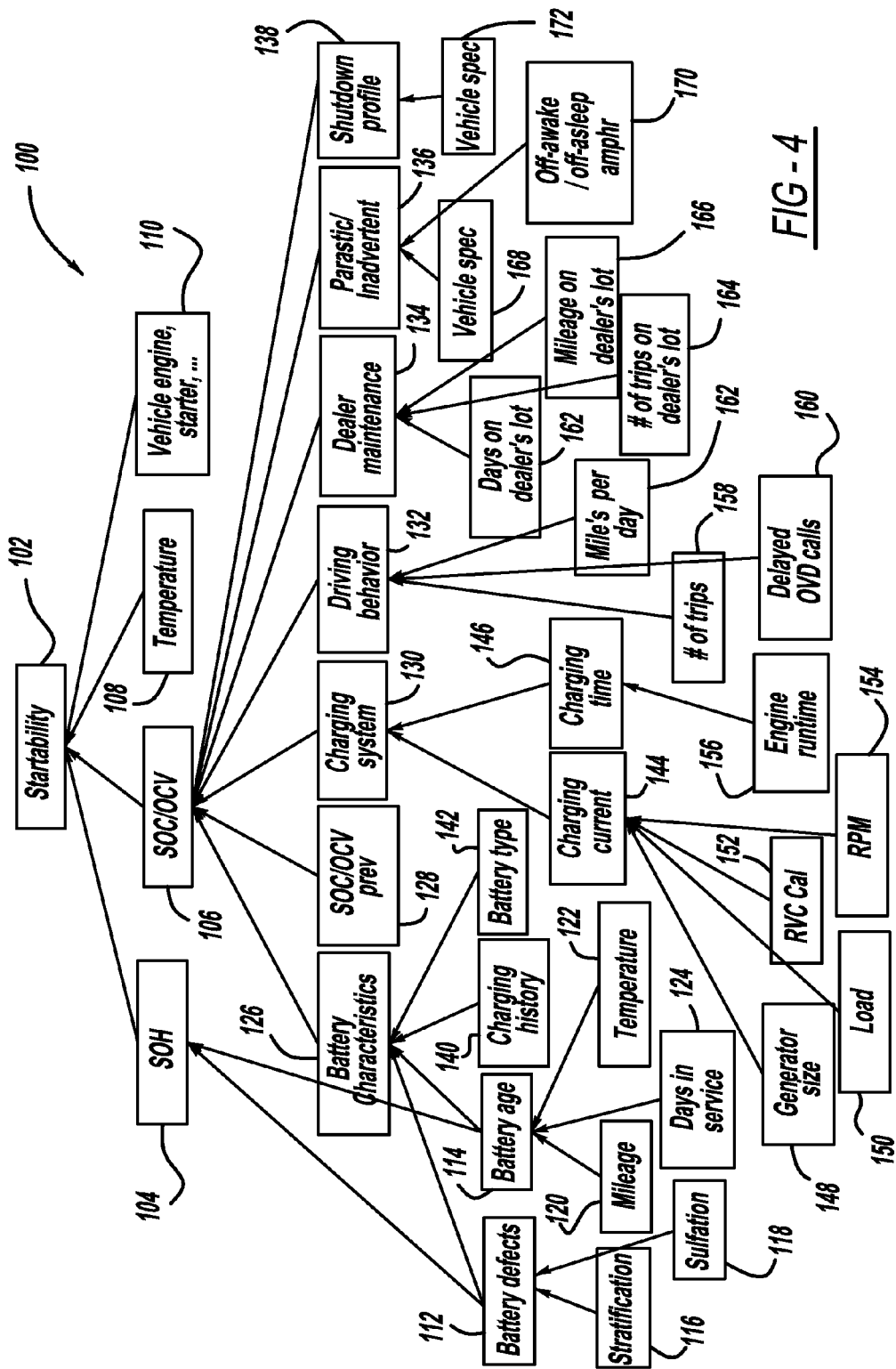
FIG. 4 is a decision tree diagram showing information used in determining whether a battery has enough charge for vehicle start-up for both the processes shown in FIGS. 2 and 3.

The parameters that can be used in the above models predict vehicle startability are illustrated in FIG. 4 in an influence diagram format. At the instant of cranking of the vehicle 12, the battery state of health is determined at box 104, the battery state of charge or open circuit voltage is determined at box 106, ambient temperature is determined at box 108 and vehicle engine and starter parameters are determined at box 110 that are used to determine startability of the box 102. Various parameters go into these determinations based on vehicle history. For example, the state of health at the box 104 can be determined based on battery defects at box 112 and battery age at box 114. Battery defects can be determined from stratification at box 116 and sulfation at box 118. Battery age can be determined based on mileage at box 120, battery temperature at box 122 and days in service at box 124. The battery state of charge and open circuit voltage at the box 106 can be determined based on battery characteristics at box 126, previous state of charge and open circuit voltages at box 128, vehicle charging system at box 130, driver driving behavior at box 132, dealer maintenance at box 134, inadvertent parasitics at box 136 and shut-down profile at box 138. The battery characteristics at the box 126 can be determined by battery defects at the box 112, battery age at the box 114, battery charging history at box 140 and battery type at box 142. The vehicle charging system at the box 130 can be determined by charging current at box 144 and charging time at box 146. The charging current at the box 144 can be determined by generator size at box 148, load at box 150, RVC calibration at box 152 and engine RMP at box 154. The charging time at the box 146 can be determined by engine run time at box 156. Driving behavior at the box 132 can be determined by the number of vehicle trips at box 158, delayed OVD calls at box 160 and miles driven per day at box 162. The dealer maintenance at the box 134 can be determined based on days on the dealers lot at box 162, the number of trips on the dealer's lot at box 164 and the mileage on the dealers lot at box 166. The inadvertent parasitics at the box 136 can be determined by vehicle specifications at box 168 and on-awake/off-asleep amp-hours at box 170. The vehicle shut-down profile at the box 138 can be determined by vehicle specifications at box 172.

The back-office module algorithm may request follow-up data uploaded from the vehicle 12 in order to further clarify the condition and determine the notification content and the notification urgency. In one non-limiting embodiment, the back-office module algorithm determines whether the ignition-on discharge current for the battery 14 is greater than a predetermined value, such as 30 amps, and whether the engine is running. If these conditions are met, then the algorithm waits for five minutes and requests an upload for the ignition-on amps, battery discharge and engine status. If the ignition-on amps of the battery 14 is above the threshold, and the battery discharge is greater than a predetermined threshold, such as 2.5 amps hours, and the engine is running, then the algorithm immediately contacts the driver and suggests a generator check. This operation detects the situation that the generator is malfunctioning and battery failure is imminent because all of the on-board electrical loads are on the battery 14, which may not last for more than an hour. As above, the values used in the algorithms are for illustration purposes and can be different for different vehicle types and makes.

Depending on the available information and the available computational power on-board the vehicle 12, the on-board module 18 may execute part of or all of the remote module algorithms. In one embodiment, the on-board module 18 may have a sophisticated algorithm that may reduce the amount of data to be uploaded and therefore reduce airtime. In another embodiment, the back-office module 24 may be upgraded when a new algorithm is available. Engineering and business judgments are needed to determine the exact partition of the algorithm on the on-board module 18 and the back-office module 24.

After the back-office module 24 determines the notification content and the notification urgency, the driver notification can be initiated by various devices, such as a vehicle computer system, by personal operators or by a combination of both. A driver notification can be conducted through various preset communication channels including, but not limited to, a vehicle imbedded phone, cell phone, station phone, etc., e-mail and short text messages. The target of the contact can be the driver or a designated person, such as a fleet manager.

Figure 5:
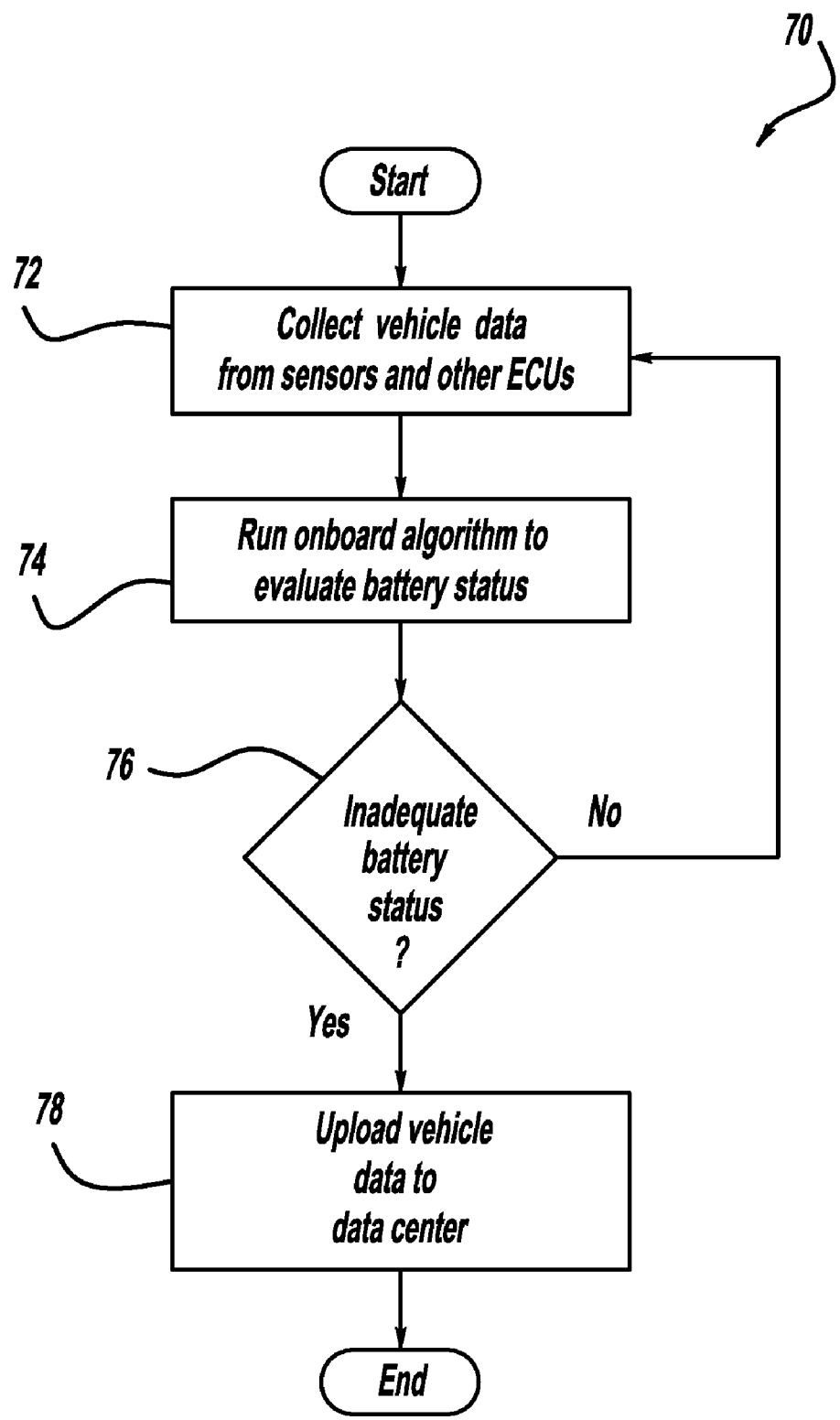
FIG. 5 is a flow chart diagram showing a process for battery analysis by an on-board module for determining battery status.

FIG. 5 is a flow chart diagram 70 showing a process for determining battery status and the no-start condition by the on-board module 18, according to an embodiment of the present invention. At box 72, the algorithm collects vehicle data from sensors and other ECUs on the vehicle 12 that are related to the operation of the battery 14. The particular on-board algorithm used to evaluate the battery status is then run at box 74. The algorithm determines whether the battery status is inadequate at decision diamond 76, and if not, returns to collecting the data at the box 72. If the algorithm determines that the battery status is inadequate as discussed above, then the algorithm uploads the vehicle data to the remote data center 22 at box 68, which will then notify the driver of the battery status.

Figure 6:
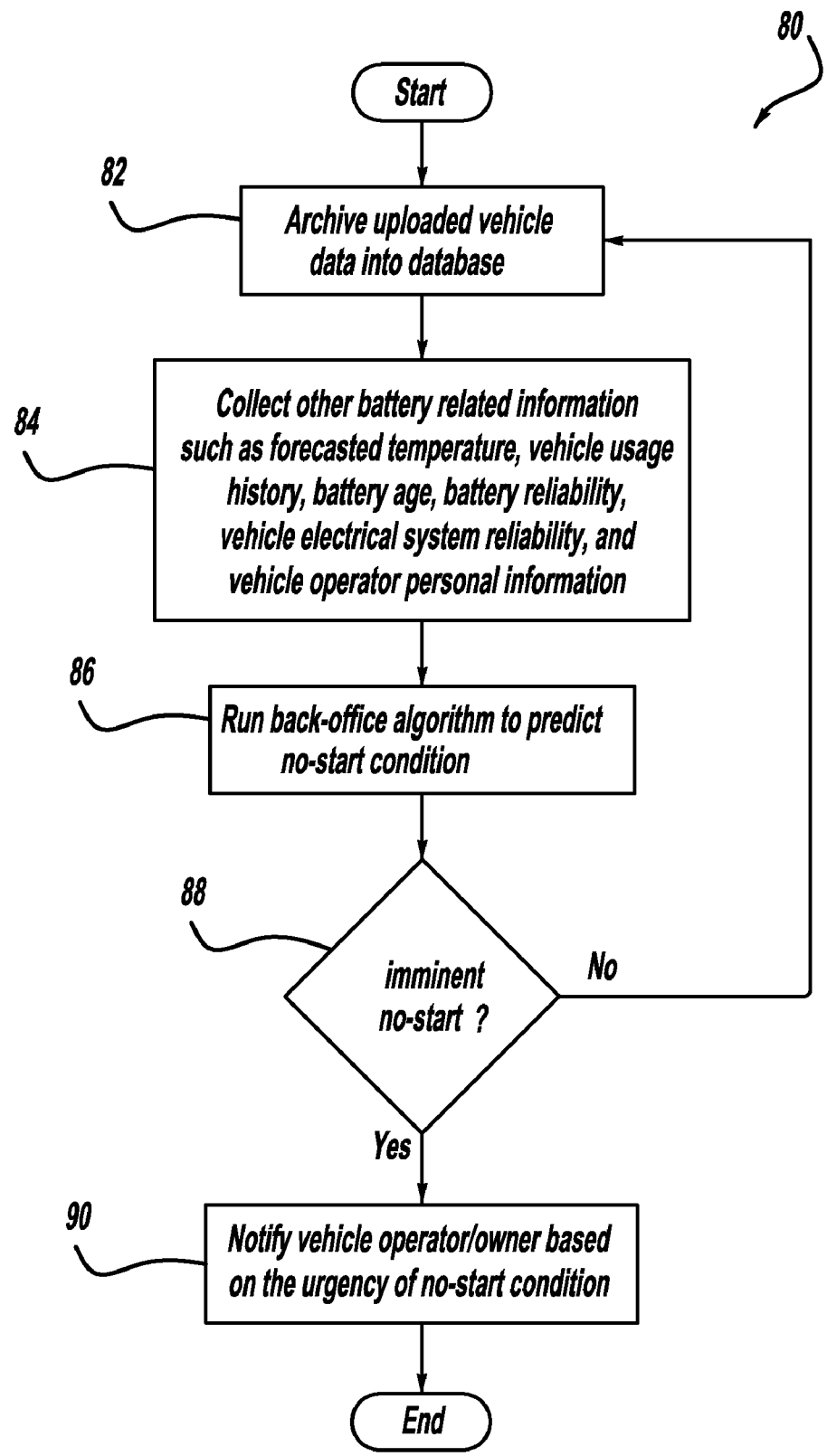
FIG. 6 is a flow chart diagram showing a process for battery analysis by a back-office module for determining battery status.

FIG. 6 is a flow chart diagram 80 showing the operation at the remote back-office 22 to determine the battery status and the no-start condition. The back-office module 24 at the back-office 22 archives uploaded vehicle data into a database at box 82. The back-office module 24 collects other battery related information from the vehicle 12, such as forecasting the temperature, vehicle usage history, battery age, battery liability, vehicle electrical system reliability and vehicle operator personal information at box 84. The back-office module 24 then runs a back-office algorithm to predict no-start situations at box 86 based on the various archived and collected data. The algorithm can use any of the processes discussed above, or other suitable processes, such as those discussed with reference to FIGS. 2 and 3. The algorithm then determines whether an imminent no-start is present at decision diamond 88, and if not, returns to the box 82 to archive uploaded vehicle data. If an imminent no-start is detected at the decision diamond 88, then the back-office module 24 will notify the vehicle operator/owner based on the urgency of the no-start situation at box 90.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining a no-start condition of a vehicle, said method comprising:
  collecting data relating to a vehicle battery on the vehicle;
  collecting and storing data relating to the vehicle battery at a remote back-office, wherein the data collected and stored at the remote back-office is received telematically directly from the vehicle;
  determining battery status including battery state of health and a predicted battery state of charge using the collected data at the remote back-office;
  determining the likelihood of a vehicle no-start condition as a result of the battery state of health and predicted battery state of charge at the remote back-office; and
  transmitting a message through pre-set communication channels from the remote back-office to a vehicle operator identifying the vehicle no-start condition if the back-office determines that the likelihood of the vehicle no-start condition exceeds a predetermined threshold.

2. The method according to claim 1 wherein determining battery status at the remote back-office includes determining the open circuit voltage of the battery.

3. The method according to claim 2 wherein determining the open circuit voltage of the vehicle includes using an open circuit voltage model to predict the open circuit voltage of the battery.

4. The method according to claim 3 wherein the open circuit voltage model determines the open circuit voltage of the battery based on past open circuit voltages of the battery, miles that the vehicle is driven per day and ambient temperature at the vehicle location.

5. The method according to claim 1 wherein determining battery status at the remote back-office includes determining how many miles per day the vehicle is being driven.

6. The method according to claim 1 wherein determining battery status at the remote back-office includes determining an ambient temperature at the vehicle location.

7. The method according to claim 1 wherein determining battery status at the remote back-office includes determining whether the vehicle is a high content vehicle.

8. The method according to claim 1 wherein determining battery status at the remote back-office includes determining whether the vehicle has been driven in a warm environment for a predetermined period of time.

9. The method according to claim 1 wherein data at the remote back-office includes collecting forecasted temperature, vehicle usage history, battery age, battery reliability, vehicle electrical system reliability, and vehicle operator personal information data.

10. The method according to claim 1 further comprising determining battery status of the vehicle battery based on the data collected on the vehicle.

11. A method for determining a no-start condition of a vehicle, said method comprising:
  collecting vehicle data on the vehicle and telematically uploading the collected data to a remote back-office directly from the vehicle;
  determining at the remote back-office a battery status including battery state of health based on the collected data; and
  determining at the remote back-office a likelihood that the vehicle will not start as a result of the battery status.

12. The method according to claim 11 wherein determining battery status includes determining the open circuit voltage of the battery.

13. The method according to claim 11 wherein determining battery status includes determining whether a battery discharge current during vehicle ignition off is greater than a predetermined threshold.

14. A method for determining a no-start condition of a vehicle, said method comprising:
  collecting data relating to a vehicle battery at a remote back-office, wherein the data collected at the remote back-office is received telematically directly from the vehicle;

determining battery status based on the collected data including predicting the battery state of change;

determining the likelihood of a vehicle no-start condition as a result of the predicted battery state of charge at the remote back-office; and transmitting a message through pre-set communication channels from the remote back-office to the vehicle operator identifying the vehicle no-start condition if the likelihood of the vehicle no-start condition exceeds a predetermined threshold.

15. The method according to claim 14 wherein determining battery status at the remote back-office includes determining the open circuit voltage of the battery.

16. The method according to claim 15 wherein determining the open circuit voltage of the vehicle includes using an open circuit voltage model to predict the open circuit voltage of the battery.

17. The method according to claim 14 wherein determining battery status at the remote back-office includes determining how many miles per day the vehicle is being driven.

18. The method according to claim 14 wherein determining battery status at the remote back-office includes determining an ambient temperature at the vehicle location.

19. The method according to claim 14 wherein collecting data at the remote back-office includes collecting forecasted temperature, vehicle usage history, battery age, battery reliability, vehicle electrical system reliability, and vehicle operator personal information data.

* * * * *